United States Patent
Tu et al.

(10) Patent No.: US 6,515,899 B1
(45) Date of Patent: Feb. 4, 2003

(54) NON-VOLATILE MEMORY CELL WITH ENHANCED CELL DRIVE CURRENT

(75) Inventors: Robert Tu, Sunnyvale; Sunil Mehta, San Jose, both of CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/010,011

(22) Filed: Nov. 9, 2001

(51) Int. Cl.[7] .............................................. G11C 16/04
(52) U.S. Cl. .............................. 365/185.05; 365/185.28
(58) Field of Search ....................... 365/185.05, 185.28, 365/185.07

(56) References Cited

U.S. PATENT DOCUMENTS

| | | | |
|---|---|---|---|
| 5,841,701 A | 11/1998 | Li et al. ................. | 365/185.28 |
| 5,969,992 A | 10/1999 | Mehta et al. .......... | 365/185.28 |
| 5,999,449 A * | 12/1999 | Mehta et al. .......... | 365/185.05 |
| 6,064,105 A | 5/2000 | Li et al. ................. | 257/510 |
| 6,172,392 B1 | 1/2001 | Schmidt et al. ....... | 257/315 |
| 6,207,898 B1 * | 3/2001 | Li et al. ................. | 257/314 |
| 6,208,559 B1 | 3/2001 | Tu et al. ................. | 365/185.18 |
| 6,215,700 B1 | 4/2001 | Fong et al. ............. | 365/185.1 |
| 6,232,631 B1 | 5/2001 | Schmidt et al. ....... | 257/315 |

\* cited by examiner

*Primary Examiner*—Vu A. Le
(74) *Attorney, Agent, or Firm*—Klarquist Sparkman, LLP

(57) ABSTRACT

A non-volatile memory cell is disclosed with increased drive current. A low voltage read transistor is used to increase the drive current. However, with a low voltage read transistor, extra protection is needed to ensure the read transistor is not damaged by high voltage. In one aspect, an isolation transistor is inserted between the read transistor and a sense transistor. The isolation transistor, read transistor and sense transistor are connected in series. When a high voltage is used during an erase operation of the memory cell, the isolation transistor absorbs some of the voltage to protect the read transistor from an excessive voltage level.

23 Claims, 4 Drawing Sheets

NON-VOLATILE MEMORY CELL WITH ENHANCED CELL DRIVE CURRENT

TECHNICAL FIELD

The invention relates to non-volatile memory and, more particularly, to a non-volatile memory cell with increased drive current.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured into a virtually unlimited number of specific logic functions. PLDs provide system designers with the ability to quickly create custom logic functions to provide product differentiation without sacrificing rapid time to market. PLDs may be reprogrammable, meaning that the logic configuration can be modified after the initial programming.

The manufacturing of PLDs has moved progressively toward defining smaller device features, characterized by the channel length of transistors. As feature sizes shrink, the conventional EEPROM structure has given way to different cell designs and array architectures, all intended to increase density and reliability in the resulting circuit. In most cases, cell designers strive for designs which are reliable, scalable, cost effective to manufacture and able to operate at lower power, in order for manufacturers to compete in the semiconductor industry.

Typically, in programmable logic EEPROM devices, to store a logical zero, electrons are injected onto a floating gate of a transistor to provide a negative voltage on the floating gate. Having a negative charge on the floating gate increases the control gate threshold voltage needed to turn on the transistor. The injection of electrons is accomplished by forcing electrons to tunnel from the source/drain region through a tunnel oxide layer or "tunnel opening" to the floating gate. Conversely, to store a logical one, the floating gate is discharged and the threshold voltage is decreased by causing electrons on the floating gate to tunnel through the tunnel opening in the opposite direction to the source/drain region.

One example of a commercially successful EEPROM structure for programmable logic applications is shown in U.S. Pat. No. 4,924,278 (hereinafter "the '278 patent"), issued to Stewart Logie on May 8, 1990 and assigned to Advanced Micro Devices, Inc., Sunnyvale, Calif.

FIGS. 1 and 2 show a schematic diagram and a cross-section, respectively, of one embodiment of the EEPROM structure shown in the '278 patent. The EEPROM structure uses a single layer of polycrystalline silicon and a control gate formed in the silicon substrate to eliminate the need to form a separate control gate and floating gate in layers of poly silicon. The EEPROM structure is made up of three separate NMOS transistors: a write transistor, a read transistor, and a sense transistor. In order to "program" the floating gate of the sense transistor, a net positive charge is placed on the gate by causing free electrons from the floating gate to tunnel into the source region of the write transistor through the tunnel opening. Likewise, to erase the floating gate, the floating gate is given a net negative charge by causing electrons to tunnel from the source region onto the floating gate through the tunnel opening.

FIG. 2 shows a standard EEPROM memory cell 10. A P-type substrate 5 has N+ type regions formed on and below its surface by standard diffusion techniques. These N+ type regions correspond to the source and drain regions of the three transistors that make up the EEPROM memory circuit. Write transistor 20 comprises drain 22, source 24, channel region 25, gate oxide layer 27 and control gate 28. Sense transistor 30 comprises drain 32, source 34, channel region 35, gate oxide layer 37, and N-type polycrystalline silicon (poly-Si) floating gate 38. Read transistor 40 comprises drain 41, source 32, which is also the drain of sense transistor 30, channel region 45, gate oxide layer 47, and control gate 48. Poly-Si floating gate 38 is capacitively coupled to source 24 of write transistor 20 via tunnel oxide layer 55 (approximately 90 .ANG. in thickness). Poly-Si floating gate 38 also extends over channel region 35 of sense transistor 30 so that when a sufficient positive charge is on poly-Si floating gate 38, channel 35 will invert and conduct current between source 34 and drain 32 of sense transistor 30.

Operation of the memory cell 10 will be described with reference to FIGS. 1 and 2. In FIG. 1, word line WL and WLR are connected to control gates 28 and 48, respectively, of write transistor 20 and read transistor 40. Tunnel oxide layer 55 (the tunnel opening) is represented by capacitor $C_t$ while gate oxide layer 37 between ACG 39 and poly-Si floating gate 38 is represented by capacitor $C_g$. Drain and source contacts are represented by D and S, respectively.

The three operations of the memory circuit are write, erase, and read. The various voltages applied to the circuit of FIG. 2 are shown in Table 1.

TABLE 1

|  | WL | Write | Read | PTG | Substrate | Control | WLR |
|---|---|---|---|---|---|---|---|
| Read | $V_{cc}$ | ground | $V_{sense}$ | ground | ground | ground | $V_{cc}$ |
| Program | $V_{pp}$ | $V_{pp}$ | HiZ | ground | ground | ground | ground |
| Erase | $V_{cc}$ | ground | HiZ | $V_{pp}$ | ground | $V_{pp}$ | $V_{cc}$ |

When N type poly-Si floating gate 38 is written upon, or programmed, the floating gate is given a positive charge by removing free electrons therefrom. To accomplish this, first, a high programming voltage $V_{pp}$ is applied to word line WL, which turns on write transistor 20. By turning on transistor 20, a write signal applied to drain 22 of write transistor 20 is coupled to source 24. High programming voltage $V_{pp}$ is applied to drain 22 of write transistor 20, while source 34 of sense transistor 30, as well as drain 41 of read transistor 40 and substrate 5, are grounded.

Because the capacitance between source 24 and floating gate 38 across tunnel oxide layer 55 is very small (on the order of 0.004 pF), and the capacitance between source 34/39 and floating gate 38 across gate oxide layer 37 is about ten times greater, a large percentage (on the order of 90%) of the voltage difference between source 24 and source 34/39 (i.e., $V_{pp}$) appears between source 24 and floating gate 38 across tunnel oxide layer 55. This voltage is sufficient to cause electron tunneling from floating gate 38 to source 24 of write transistor 20 through tunnel oxide layer 55, resulting in a net positive charge on floating gate 38. The positive charge is sufficient to turn on sense transistor 30 because floating gate 38 extends over channel region 35 of sense transistor 30. This indicates a logical 1 since current can flow through sense transistor 30 during a read operation.

To erase floating gate 38 high programming voltage $V_{cc}$ is applied to word line WL and $V_{pp}$ to source 34 of sense transistor 30/39, while drain 22 of write transistor 20 and substrate 5 are grounded. In this biasing arrangement, the high voltage at source 34/39 is capacitively coupled to floating gate 38 and almost all of high programming voltage $V_{pp}$ appears across tunnel oxide layer 55 between floating gate 38 and grounded source 24. This causes electrons from source 24 to tunnel through tunnel oxide layer 55, resulting in a net negative charge on floating gate 38. Thus, channel 35 of sense transistor 30 is not inverted and sense transistor 30 is shut off.

The memory cell 10 of FIGS. 1 and 2 has been reliably used for many years. Nonetheless, as is typical in the electronics industry, it is desirable to further increase speed and reduce the size of the memory cell. Unfortunately, as oxide thickness of transistors in the non-volatile memory cells are continually scaled down, such transistors are susceptible to the high voltages used in programming and erasing the cell. For example, in FIG. 1, when a high voltage is placed on PTG, this voltage is passed to node A, which correspondingly places a high voltage across the gate and channel of the read transistor 40. In order to withstand this high voltage, the read transistor 40 must have a thicker oxide layer (e.g., 85 A (Angstrom)). This thicker oxide layer, in turn, limits the current drive of the read transistor 40, and, hence, the speed of the memory cell is slowed. Reducing the voltage at PTG during the erase helps with this problem, but makes erasing harder and the cell size must be increased to compensate.

Thus, it is desirable to have a non-volatile memory cell with increased drive current in order to increase the speed of the memory cell. Additionally, it is desirable to have such a memory cell that can withstand higher voltages used during programming and erasing of the memory cell.

SUMMARY

The invention is a non-volatile memory cell with increased drive current. A low-voltage read transistor is used (e.g., 30 A) to increase the drive current. However, with a low-voltage read transistor, extra protection is needed to ensure the read transistor is not damaged by high voltage.

In one aspect, an isolation transistor is inserted between the read transistor and a sense transistor. The isolation transistor, read transistor and sense transistor are coupled in series. When a high voltage is placed on PTG, the isolation transistor absorbs some of the voltage, thereby protecting the read transistor from an excessively high voltage level.

In another aspect, the isolation transistor shares an N-source/drain on one side with the read transistor and an N-source/drain on the opposing side with the sense transistor.

In yet another aspect, the oxide layer on the read transistor is sized to be thinner than both the sense and isolation transistors. For example, the read transistor's oxide layer may be 30 A, while the sense and isolation transistors have oxide layers of 85 A.

These and other aspects of the invention will become apparent from the followed detailed description, which makes references to the accompanying drawings.

DETAILED DESCRIPTION

Figure 1:
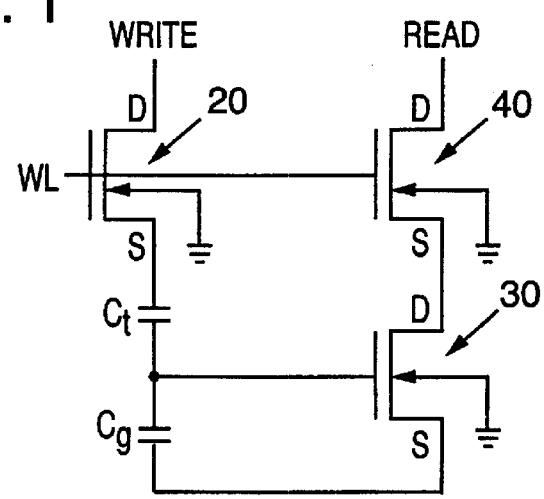
FIG. 1 is a schematic diagram of a prior art EEPROM cell used in a programmable logic device.
Figure 3:
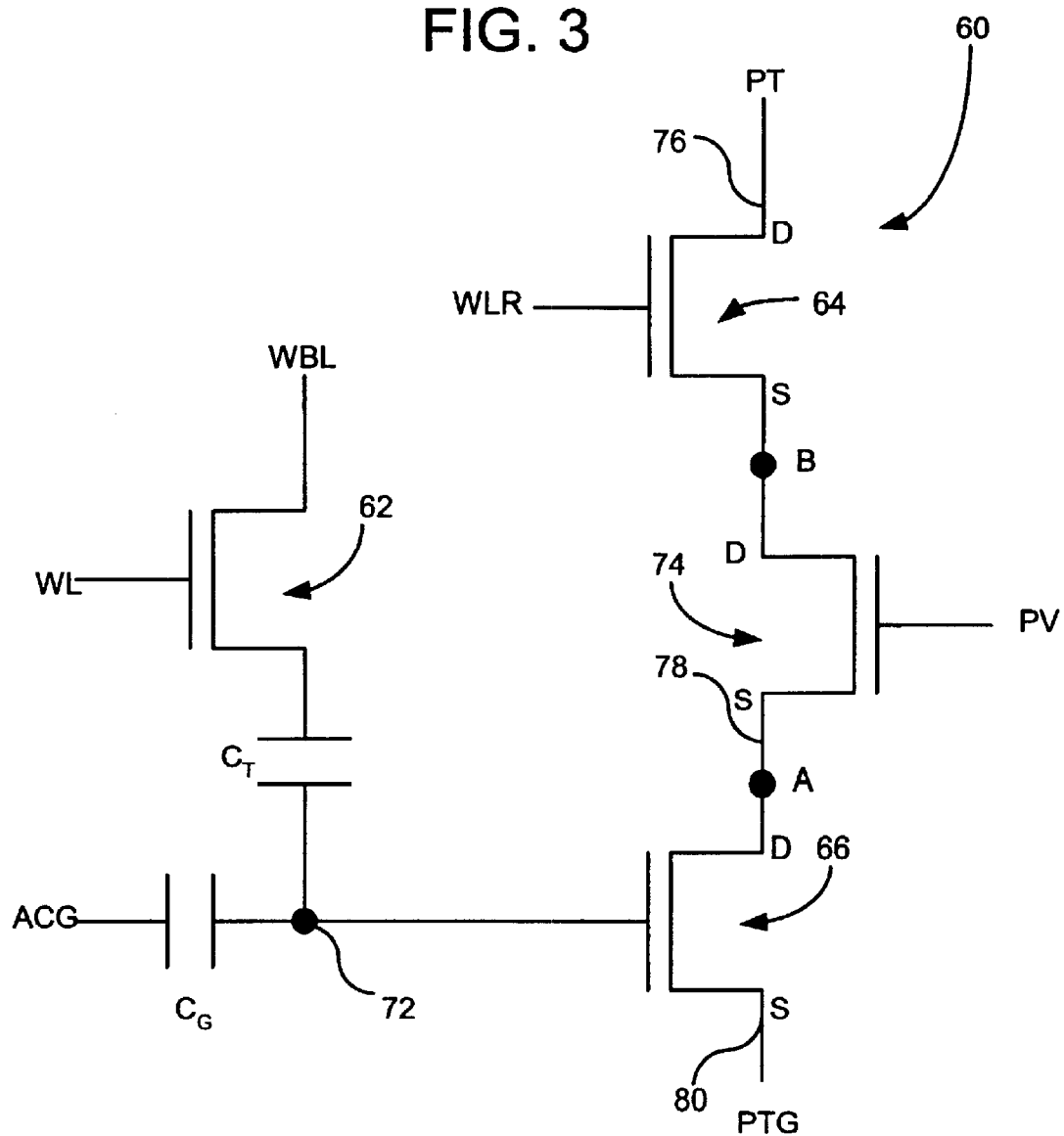
FIG. 3 shows a schematic diagram of an EEPROM cell according to the invention.

FIG. 3 shows an example of an EEPROM cell 60. The EEPROM cell 60 includes a write transistor 62 and a sense transistor 66, similar to those described already in relation to FIG. 1. Read transistor 64 is a low-voltage oxide transistor used to increase drive current. An example read transistor has an oxide thickness of 30 A, but other thicknesses may be used. Additionally, a tunneling oxide layer is represented by capacitor $C_t$ and a program junction oxide layer between a control gate (ACG) and a floating gate 72 is represented by capacitor $C_g$. An isolation transistor 74 is positioned between the read transistor 64 and the sense transistor 66. A source-drain path 76 (labeled S and D) of the read transistor 64 is coupled in series with the source-drain path 78 of the isolation transistor 74 at node B. The source-drain path 80 of the sense transistor 66 is coupled in series with the source-drain path 78 of the isolation transistor 74 at node A. Example oxide thicknesses in the write 62, isolation 74, and sense transistors 66 are 85 A.

Figure 4:
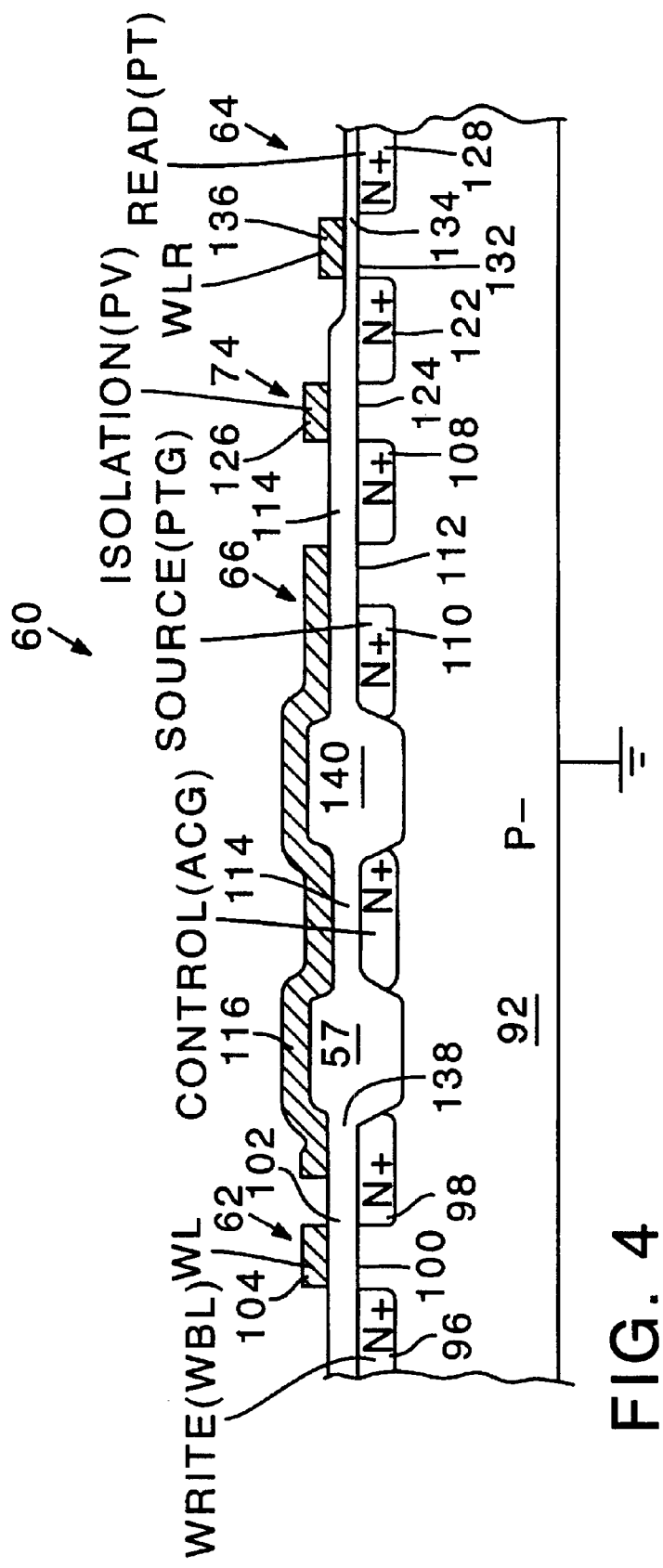
FIG. 4 is a cross-sectional view of the EEPROM cell shown in FIG. 3.

FIG. 4 shows a cross-sectional view of the EEPROM memory cell 60 of FIG. 3. A P-type substrate 92 has N+ type regions formed on and below its surface by standard diffusion techniques. These N+ type regions correspond to the source and drain regions of the four transistors that make up the EEPROM memory circuit. Write transistor 62 comprises drain 96, source 98, channel region 100, gate oxide layer 102 and control gate 104. Sense transistor 66 comprises drain 108, source 110, channel region 112, gate oxide layer 114, and N-type polycrystalline silicon (poly-Si) floating gate 116 (66).

Isolation transistor 74 has a drain 122 and a source 108, which is also the drain of the sense transistor 66 (i.e., a shared active region). A channel region 124 is positioned between the drain 122 and source 108. A gate 126 controls whether or not the isolation transistor is activated.

Read transistor 64 comprises a drain 128, a source 122, which is also the drain of isolation transistor 74 (i.e., a shared active region), a channel region 132, a gate oxide layer 134, and a control gate 136. The gate oxide layer 134 is thinner for the read transistor than the oxide layer 114 for both the sense and isolation transistors as shown in FIG. 4. Poly-Si floating gate 116 is capacitively coupled to source 110 of sense transistor 66, via gate oxide layer 114 and capacitively coupled to source 98 of write transistor 62 via tunnel oxide layer 138. Poly-Si floating gate 116 also extends over channel region 112 of sense transistor 66 so that when a sufficient positive charge is on poly-Si floating gate 116, channel 112 will invert and conduct current between source 110 and drain 108 of sense transistor 66. Field oxide layer 140 insulates floating gate 116 from the underlying substrate 92.

Operation of the memory cell 60 will be described with reference to FIGS. 3, 4, and 5. The various voltages applied to the memory cell 60 are shown in Table 2.

TABLE 2

|  | WBL | ACG | WL | PT | PTG | WLR | PV |
|---|---|---|---|---|---|---|---|
| Program | $V_{pp}$ | grnd | $V_{pp+}$ | HiZ | grnd | $V_{cc}$/grnd | $V_{cc}$ |
| Erase | grnd | $V_{pp+}$ | $V_{cc}$ | HiZ | $V_{pp}$ | $V_{cc}$ | $V_{hi}$ |
| Read | grnd | grnd | $V_{cc}$ | $V_{pp+}$ | grnd | $V_{cc}$/grnd | $V_{hi}$ |

Figure 2:
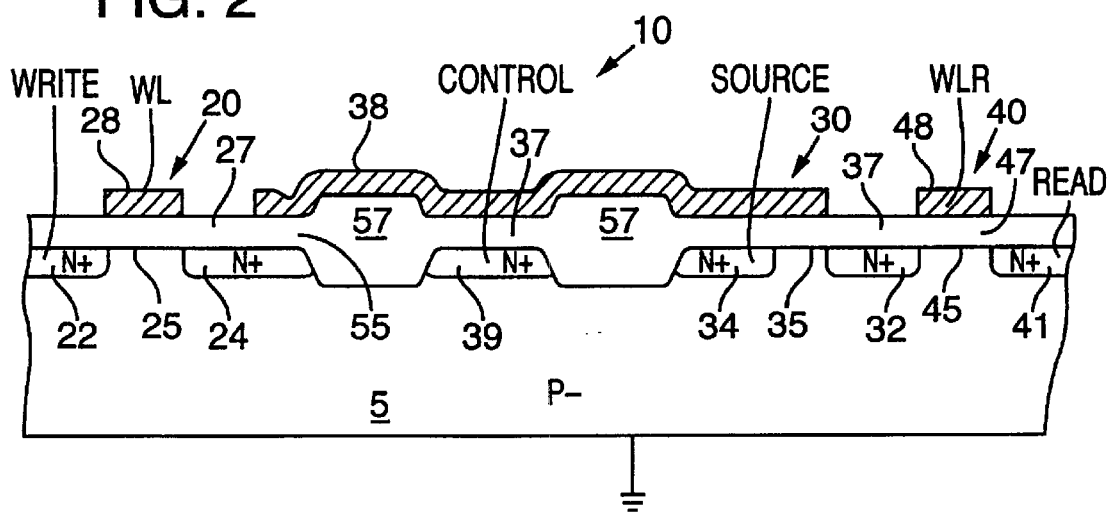
FIG. 2 is a cross-sectional view of the EEPROM cell shown in FIG. 1.
Figure 5:
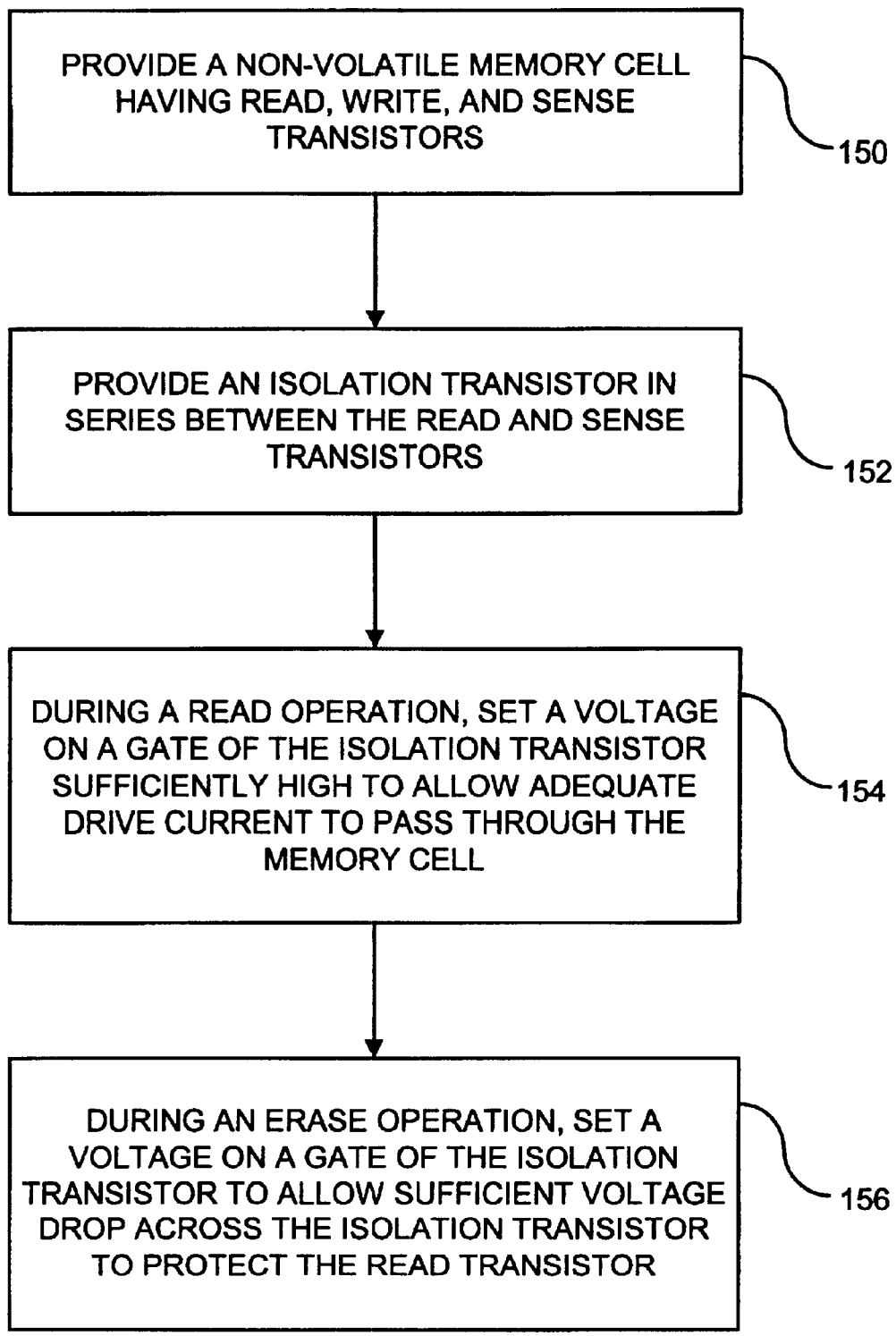
FIG. 5 is a flowchart of a method for enhancing drive current in a non-volatile memory cell.

FIG. 5 shows a flowchart relating to the operation of the memory cell 60. The operation of the memory cell is similar to that already described in relation to FIG. 1 and FIG. 2, except that the voltage PV on the isolation transistor is properly biased to ensure high drive current and adequate voltage drop across the isolation transistor. Thus, in sum, the voltage PV is an intermediate voltage between Vcc and Vpp chosen to meet the conditions that during a read, it is high enough to pass through the high-voltage oxide transistor 74 most of the current passed by the read transistor 64. During an erase, the voltage PV is chosen such that the voltage passed to node B is not high enough to damage the oxide of the read transistor 64. In process block 150, a non-volatile memory cell is provided with read, write, and sense transistors, as previously described. An isolation transistor is provided in series between the read and sense transistors (process block 152). During a read operation, a voltage is set on the gate of the isolation transistor that is sufficiently high to allow adequate drive current to pass through the memory cell (process block 154). For example, because a low-voltage read transistor is used that has high drive current, it is desirable to set the gate voltage on the isolation transistor sufficiently high to pass a substantial portion of current from the read transistor 64. Charge pumping may be used to obtain sufficient voltage on the isolation transistor without impacting performance because the isolation transistor is not switching. During an erase operation, voltage is set on the gate of the isolation transistor to ensure that the read transistor is protected (process block 156). For example, during an erase operation, a large PTG voltage is used that brings node A (FIG. 3) to a high voltage level. A voltage drop across the isolation transistor brings the voltage at node B to an acceptable voltage level so as not to harm the read transistor 64. The voltage level on the gate of the isolation transistor 74 is not of concern during program mode.

Because of the isolation transistor 74, the read transistor 64 has a thinner oxide layer, which increases the overall drive current of the cell.

Having illustrated and described the principles of the illustrated embodiments, it will be apparent to those skilled in the art that the embodiments can be modified in arrangement and detail without departing from such principles.

Although the isolation transistor is shown as an NMOS transistor, PMOS transistors may also be used.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A non-volatile memory cell structure, comprising:
   a floating gate that stores a state of the non-volatile memory cell structure;
   a sense transistor having a gate and a source-drain path, with the gate of the sense transistor connected to the floating gate;
   a read transistor having a gate and a source-drain path; and
   an isolation transistor connected between the source-drain path of the read transistor and the source-drain path of the sense transistor.

2. The non-volatile memory cell structure of claim 1, further including a write transistor capacitively coupled to the floating gate.

3. The non-volatile memory cell structure of claim 1, wherein the sense, read, and isolation transistors are connected in series.

4. The non-volatile memory cell structure of claim 1, wherein the floating gate stores a charge indicating a state of the memory cell.

5. The non-volatile memory cell structure of claim 1, wherein the read transistor has a thinner oxide layer than the oxide layers of the sense and isolation transistors.

6. The non-volatile memory cell structure of claim 1, wherein the isolation transistor includes a gate connected to a separately contolled voltage signal.

7. The non-volatile memory cell structure of claim 1, wherein the floating gate is physically isolated by an oxide layer.

8. The non-volatile memory cell structure of claim 1, wherein the read transistor shares an active region with the isolation transistor and the isolation transistor shares an active region with the sense transistor.

9. The non-volatile memory cell structure of claim 1, wherein the sense transistor has opposing N-source/drains with a channel region therebetween and the floating gate extends over the channel region of the sense transistor.

10. The non-volatile memory cell structure of claim 1, further including a write transistor having a drain and source and wherein the floating gate is capacitively coupled to the source of the write transistor through a tunnel opening in an oxide layer.

11. A non-volatile memory cell structure, comprising:
   a floating gate;
   a write transistor;
   an oxide layer between the write transistor and the floating gate forming a tunnel opening therebetween through which the floating gate is erased and programmed;
   a sense transistor having opposing active regions separated by a channel region, wherein the floating gate is positioned over the channel region of the sense transistor;
   a read transistor; and
   an isolation transistor positioned between the read and sense transistors such that the isolation, read and sense transistors are connected in series.

12. The non-volatile memory cell structure of claim 11, wherein the read transistor shares an active region with the isolation transistor and the isolation transistor shares an active region with the sense transistor.

13. The non-volatile memory cell structure of claim 11, wherein the read transistor has a thinner oxide layer than the oxide layers of the sense and isolation transistors.

14. The non-volatile memory cell structure of claim 11, wherein the floating gate stores a charge indicating a state of the memory cell.

15. A method of using a non-volatile memory cell structure, comprising:
   providing read, write, and sense transistors;
   providing an isolation transistor between the read and sense transistors;

during a read operation of the memory cell structure, setting a voltage on a gate of the isolation transistor sufficient to allow adequate drive current to pass through the memory cell; and during an erase operation of the memory cell structure, setting a voltage on the gate of the isolation transistor to a voltage level sufficient to ensure an adequate voltage drop across the isolation transistor needed to protect the read transistor from excessive voltage.

16. The method of claim 15, further including providing a floating gate with an oxide layer between a source of the write transistor and the floating gate and tunneling electrons through the oxide layer to erase and program the non-volatile memory cell.

17. A non-volatile memory cell structure, comprising:

means for sensing a voltage on a floating gate;

means for reading the voltage on the floating gate; and means for electrically isolating the reading means from the sensing means.

18. The non-volatile memory cell structure of claim 17, further including writing means for programming and erasing the floating gate.

19. The non-volatile memory cell structure of claim 18, further including tunneling means connected to the writing means for allowing electrons to pass to and from the floating gate.

20. A non-volatile memory cell structure, comprising:

a floating gate;

four transistors forming the non-volatile memory cell structure, the four transistors including:

a read transistor having a read line connected to a gate of the read transistor;

a sense transistor having its gate as part of the floating gate of the non-volatile memory cell;

an isolation transistor positioned between the sense transistor and the read transistor; and a write transistor having a gate connected to a write line and having a source region capacitively coupled to the floating gate through a tunnel region in an oxide layer between the source region and the floating gate.

21. The non-volatile memory cell structure of claim 20, wherein there are exactly four transistors forming the memory cell structure.

22. The non-volatile memory cell structure of claim 20, wherein the sense, isolation, and read transistors are connected in series.

23. The non-volatile memory cell structure of claim 20, wherein the read transistor shares an active region with the isolation transistor and the isolation transistor shares an active region with the sense transistor.

* * * * *